United States Patent [19]

Bayne

[11] 4,431,361

[45] Feb. 14, 1984

[54] METHODS OF AND APPARATUS FOR TRANSFERRING ARTICLES BETWEEN CARRIER MEMBERS

[75] Inventor: Christopher J. Bayne, Lightwater, England

[73] Assignee: Heraeus Quarzschmelze GmbH, Hanau, Fed. Rep. of Germany

[21] Appl. No.: 297,632

[22] Filed: Aug. 31, 1981

[30] Foreign Application Priority Data

Sep. 2, 1980 [GB] United Kingdom ................ 8028248
Jul. 27, 1981 [GB] United Kingdom ................ 8123122

[51] Int. Cl.³ ..................... B65G 65/04; B65G 65/30
[52] U.S. Cl. .................................. 414/405; 414/786
[58] Field of Search ............... 414/405, 404, 403, 417, 414/206, 786

[56] References Cited

U.S. PATENT DOCUMENTS

| | | | |
|---|---|---|---|
| 2,386,076 | 10/1945 | Taylor et al. ........................ | 414/417 |
| 2,856,089 | 10/1958 | Lennon ................................ | 414/417 |
| 3,501,825 | 3/1970 | Alexander . | |
| 3,949,891 | 4/1976 | Butler et al. ........................ | 414/405 |
| 4,311,427 | 1/1982 | Coad et al. .......................... | 414/417 |
| 4,344,730 | 8/1982 | Dvorak ................................ | 414/405 |

FOREIGN PATENT DOCUMENTS

| | | |
|---|---|---|
| 1764819 | 3/1974 | Fed. Rep. of Germany . |
| 53-75866 | 5/1978 | Japan . |
| 55-85038 | 6/1980 | Japan . |

Primary Examiner—Bruce H. Stoner, Jr.
Assistant Examiner—James E. Barlow
Attorney, Agent, or Firm—Frishauf, Holtz, Goodman & Woodward

[57] ABSTRACT

Articles, such as fragile, delicate semiconductor wafers, in a first carrier member are caused to pass nearly, but not quite wholly, into a second carrier member by being pushed—against gravity—thereinto. The carrier members are then subjected to a displacement, e.g. by inversion, and said articles are allowed to drop wholly into said second carrier member. The further distance travelled by the articles after rotational displacement of a housing retaining the carrier members is very small, e.g. about 2 mm.

19 Claims, 9 Drawing Figures

METHODS OF AND APPARATUS FOR TRANSFERRING ARTICLES BETWEEN CARRIER MEMBERS

The present invention relates to a method of and apparatus for transferring articles, particularly thin articles of a disclike nature, from one carrier member to another. The invention is particularly suitable for transferring unprocessed semi-conductor wafers from a first carrier member (hereinafter also referred to simply as a "carrier") to a second carrier member (hereinafter also referred to as a "magazine") so that they may be processed, e.g. in a furnace in which the magazine is introduced. The magazine therefore must be resistant to processing temperatures and in this particular art would generally be made from fused silica, whereas the carrier may be made from any suitable material, generally a suitable plastics material. The apparatus may also be used for re-transferring processed wafers back to the carrier. In the course of such transfer operations handling of the delicate wafers must be kept to a minimum to prevent damage and contamination which would lead to rejection of the very expensive articles.

BACKGROUND

Apparatus for effecting such transfer operations is already known e.g. from U.S. Pat. No. 3,949,891 filed July 22nd 1974 and entitled "Semi Conductor Wafer Transfer Device" but, irrespective of whether they are manually or automatically operated, they suffer from the disadvantage that the transfer was affected by bringing the two carrier members into an inverted position in register and the two devices were turned over, together. Therefore the wafers fell a distance roughly equal to the added depths of both carrier members; this may lead to cracking or chipping of wafer edges and lead to frequent rejection of the wafers.

THE INVENTION

It is therefore an object to provide a method of and transfer apparatus for this purpose which will respectively employ and operate with only a very small dropping movement of the articles and to reduce the risks of contamination by handling, to a negligible degree.

Briefly, the the invention consists in a method of transferring articles between first and second carrier members, includes a step wherein articles in a first carrier member are caused to pass nearly, but not quite wholly, into a second carrier member; then the carrier members are subjected to a displacement and said articles are allowed to pass wholly into said carrier member.

The carrier members are conveniently located in a housing and the displacement is effected by inverting said housing, advantageously by a rotary movement, the final movement of the articles being under the control of gravity.

The invention also provides transfer apparatus which comprises a displaceable housing for containing a baffle means adapted to receive articles from a first carrier member placed in the housing and pass such articles into a second carrier member along a distance less than that represented by a final desired position, the full distance to said final desired position being travelled by said articles only after displacement of said housing.

Advantageously the displacement referred to is an inversion, the housing, for this purpose, being rotatably mounted and the further distance travelled by the articles after rotational displacement of the housing being under the influence of gravity and of very small dimensions which is defined herein as being of the order of 2 mm.

Locking means are preferably provided to prevent the housing being inadvertantly displaced before the transfer of the articles.

For example, the housing may be mounted on a horizontal spindle for movement through 180° in either direction.

The housing may have frontal and/or lateral loading and unloading ports to enable the carrier members to be loaded into and unloaded from the housing.

BRIEF DESCRIPTION OF THE DRAWINGS

In order that the invention may be more clearly understood, reference will now be made to the accompanying drawings which show one specific embodiment thereof by way of example only, and in which.

DETAILED DESCRIPTION OF PREFERRED EMBODIMENTS

Figure 1:
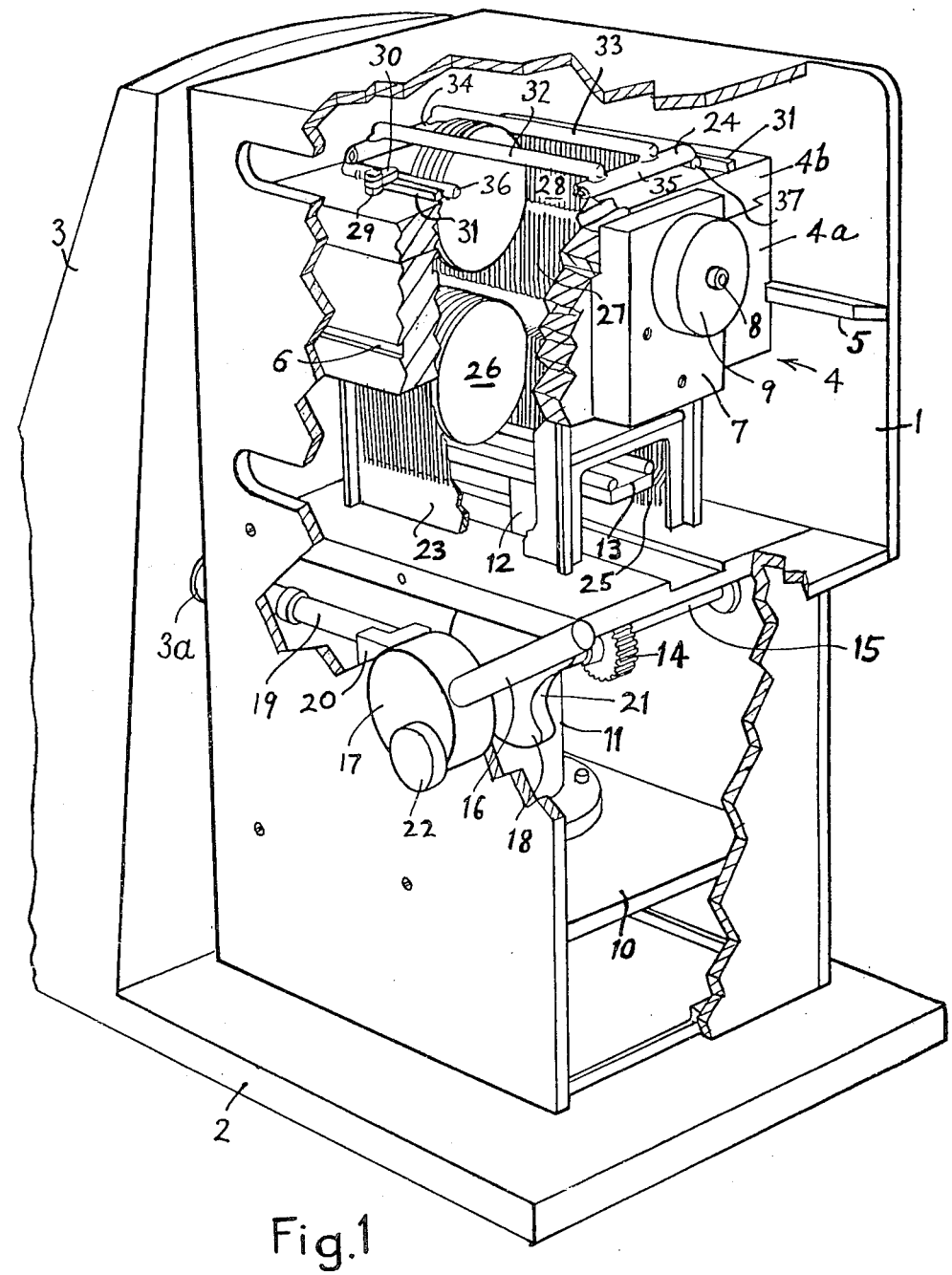
FIG. 1 is a three-quarter view from the front of a first embodiment of a complete apparatus.

Referring to the drawings, in FIG. 1 there is shown a first embodiment of a transfer mechanism incorporating the basic features of the invention and comprising a housing 1 rotatable about a horizontal axis in relation to a stand 2. The housing has a spindle projecting axially from its rear end to engage in anti-friction bearings in an aperture in the vertical portion 3 of the stand 2 (the spindle and aperture are not shown). The front end of the upper part of the housing is open, to gain access to a shuttle baffle 4, constituting the baffle means hereinabove referred to, and being in two parts 4a and 4b, the upper part 4b being slidable relative to the lower part 4a. The whole shuttle baffle unit is carried by and longitudinally slidable on, a pair of rails 5 secured to the inside of housing 1, the sides of the shuttle baffle being grooved at 6 for this purpose.

To the frontal end of the shuttle baffle 4a is secured a flange through a threaded aperture in which passes a threaded operating plunger 8, whose front end is secured to a hand wheel 9. Rotation of the hand wheel 9 effects a translational movement of the upper part 4b of the shuttle baffle, the rear end of plunger 8 bearing on the front end of part 4b. The translational movement of part 4b is stopped by a stop disc or plate secured to the rear face of part 4a (not shown). The rear end of plunger 8 may be coupled to the front end of part 4b in such a manner that the plunger 8 can rotate, or the part 4b may be spring-loaded so that in any event rotation of wheel 9 in one direction will affect a front to rear translation of the part 4b and a rotation of wheel 9 in the opposite direction will affect a rear to front translation of the part 4b.

In the lower part of housing 1 there is provided a platform 10 to which is secured a guide boss 11 through which passes a lifting pillar 12 to the upper end of which is secured a support member 13. A rack (not shown) is formed in or attached to the front longitudinal circumference of pillar 12, which rack is engaged by a pinion 14 secured to a shaft 15 which passes through the walls of the lower part of housing 1, as shown. To one end of shaft 15 is secured a handle 16, conveniently via a disc 17, outside the housing whereby rotation of handle 16 rotates shaft 15 to cause a vertical movement of pillar 12 and support member 13.

The spindle 15 also carries a cam disc 18 inside the casing and a locking rod 19 passes through the rear wall of housing 1 and is supported at its front end in a bracket 20 secured to the inner wall of the housing. The locking rod 19 passes rearwardly into an apertured boss 3a in the vertical part 3 of stand 2 so as to secure the housing 1 against rotation. The front end of rod 19 is spring-urged against the periphery of cam disc 18 so that when a cut-out 21 in cam disc 18 meets the front end of locking rod 19, the latter is urged forwardly to free the rear end of rod 19 from the apertured boss 3a in vertical part 3 to allow rotation of housing 1 about its horizontal mounting spindle. Similarly, the disc 17 carries a spring-loaded plunger, (not shown) passing therethrough into an aperture in the adjustment side wall of housing 1, the exterior end of this plunger bearing an operating head 22. It will be clear that at a suitable angular position of handle 16, this plunger will automatically enter the aperture and lock the shaft 15 against further rotation until the plunger is withdrawn by hand to release the shaft 15.

This construction enables transfer of articles from a first carrier member i.e. carrier 23, to a second carrier member i.e. a magazine 24 and vice versa the carrier 23 being a cage open at top and bottom and its side walls being grooved so as to receive a number of articles e.g. discs 26, such as semi-conductor wafers, the spacing between these side walls being such as to retain the articles 26 at diametrically opposite points so that they depend towards the open bottom of the cage.

The interior walls of parts 4a and 4b of shuttle baffle 4 are also grooved as 27 and 28 to allow passage of the articles 26 as will be explained. Preferably the grooved portions take the form of separate insert bodies screwed or otherwise secured to the respective baffle parts so that they may be removed for easy cleaning. Whilst any material found suitable may be used to make the shuttle baffle, we have found that polypropylene is one suitable material for the body thereof and the groove-inserts may be of polytetrafluoroethylene. The magazine 24 is made from fused silica and the stand and housing may be made from any rigid plastics material as are the other parts. The pinion and its associated rack may be made from nylon.

Figure 9:
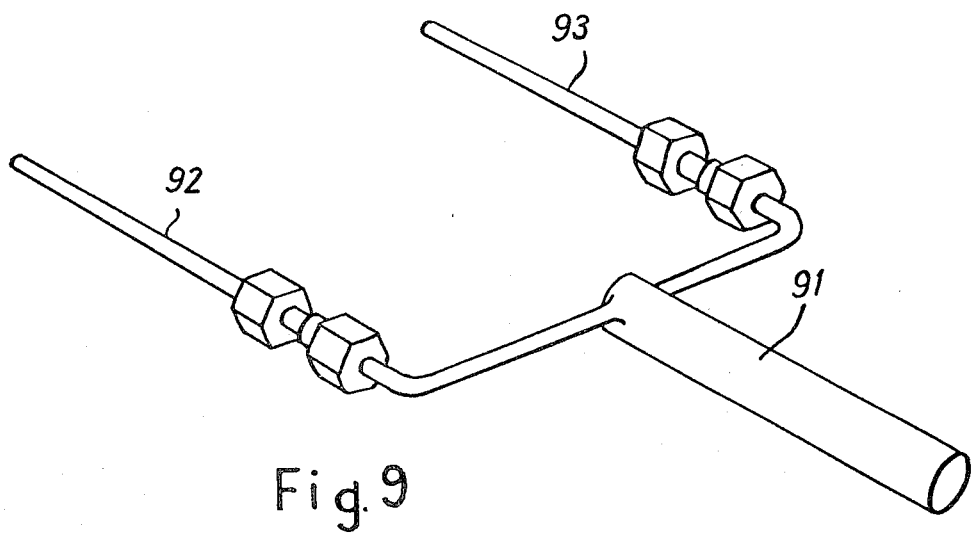
FIG. 9 is a view of a lifting fork.

The magazine 24 is arranged to be clamped to the upper part of shuttle baffle 4 by means of locking arms 29, two on each side of the baffle 4, which are secured thereto by screws or the like so that they may pivot. The limbs of the arms 29 are pinned to operating rods 31 so that longitudinal movement of each rod causes the working arms 29 to pivot on their screws. If desired the one ends of each operating rod 31 may be secured together by transverse tie provided with an operating handle whereby movement of the latter may move both rods 31 and therewith all four arms 29 simultaneously, but this simple mechanical expedient will be apparent to those skilled in the art and has therefore not been shown. The magazine 24 is constituted by two longitudinal struts 32 and 33 joined together by transverse struts 34 and 35 and two further longitudinal struts 36 and 37 secured to the ends of the struts 34 and 35 which latter are in the form of tubes, open at their respective ends whereby the holder can be loaded unto and removed from the shuttle baffle 4 by a forked hand tool e.g. as shown in FIG. 9, comprising a handle device having two spaced tines arranged to be passed into the tube ends.

The interior surface of the struts 32, 33, 36 and 37 are transversely grooved, each set of four grooves being intended to accommodate one article such as a disc 26, but the spacing between the grooves in these struts as well as the grooves 28 in part 4b of the shuttle 4, is half that of the grooves 25 in carrier 23 and grooves 27 in part 4a of baffle 4, so that the magazine 24 is capable of holding twice as many articles as the carrier 23. However, it will be appreciated that this pertains only to the embodiment shown and the holding capabilities of the carrier members may be varied as desired.

An empty magazine 24 is placed upside down, as shown, on the upper face of baffle part 4b and is locked in position by locking arms 29 whilst the baffle 4 is outside the apparatus. The baffle is then slid into the upper part of housing 1 on slide rails 5. A carrier 23, loaded with articles 26 is inserted into housing 1 beneath the baffle 4. The operating head 22 is then pulled out under spring pressure, to release its plunger from the aperture in the wall of the lower part of housing 1. The handle 16 can then be operated to lift pillar 12 and support member 13 to cause the articles 26 to pass into the baffle 4 occupying alternate grooves in part 4b, until the plunger on head 22 again locks handle 16 at which time it is arranged that the articles 26 do not fully bottom in the grooves in longitudinal struts 32, 33 i.e. they are not fully "home" into the magazine 24, being short by, say, 2 mm. At this time the locking rod 19 will also be freed from part 3 of stand 2 whereupon the housing 1 is rotated clockwise through 180° until it reaches a stop (not shown), thus inverting the carrier members so that they exchange positions. The shuttle baffle 4 is then indexed by rotating hand wheel 9 until it meets and end stop thereby achieving the closure of grooves occupied by the first load of articles 26, and opening each unoccupied slot in magazine 24 and part 4b of baffle 4, ready to receive the second load of articles 26. The articles 26 thus enter the magazine 24 with minimum force by gravity but they will have suffered no damage due to the fact that the dropping distance is so small.

The housing 1 is then rotated anti-clockwise through 180° and returned to its initial position. The operating head 22 is then retracted and handle 16 is moved back to its start position, thereby returning support member 13. The empty carrier 23 is removed and replaced by a second loaded one and the operation is repeated, the articles from this second carrier being loaded into the grooves between those first loaded. Thus the magazine 24 contains the contents of both carriers 23, the second "load" also having been gently dropped into the "home" position on the next rotation of the housing 1.

The shuttle baffle 4 can then be removed from the apparatus and magazine 24 lifted off after releasing the locking arms 29.

Unloading a magazine 24 and distributing its load of articles 26 into two carriers 23, is carried out by a reversal of the above procedure.

Figure 4:
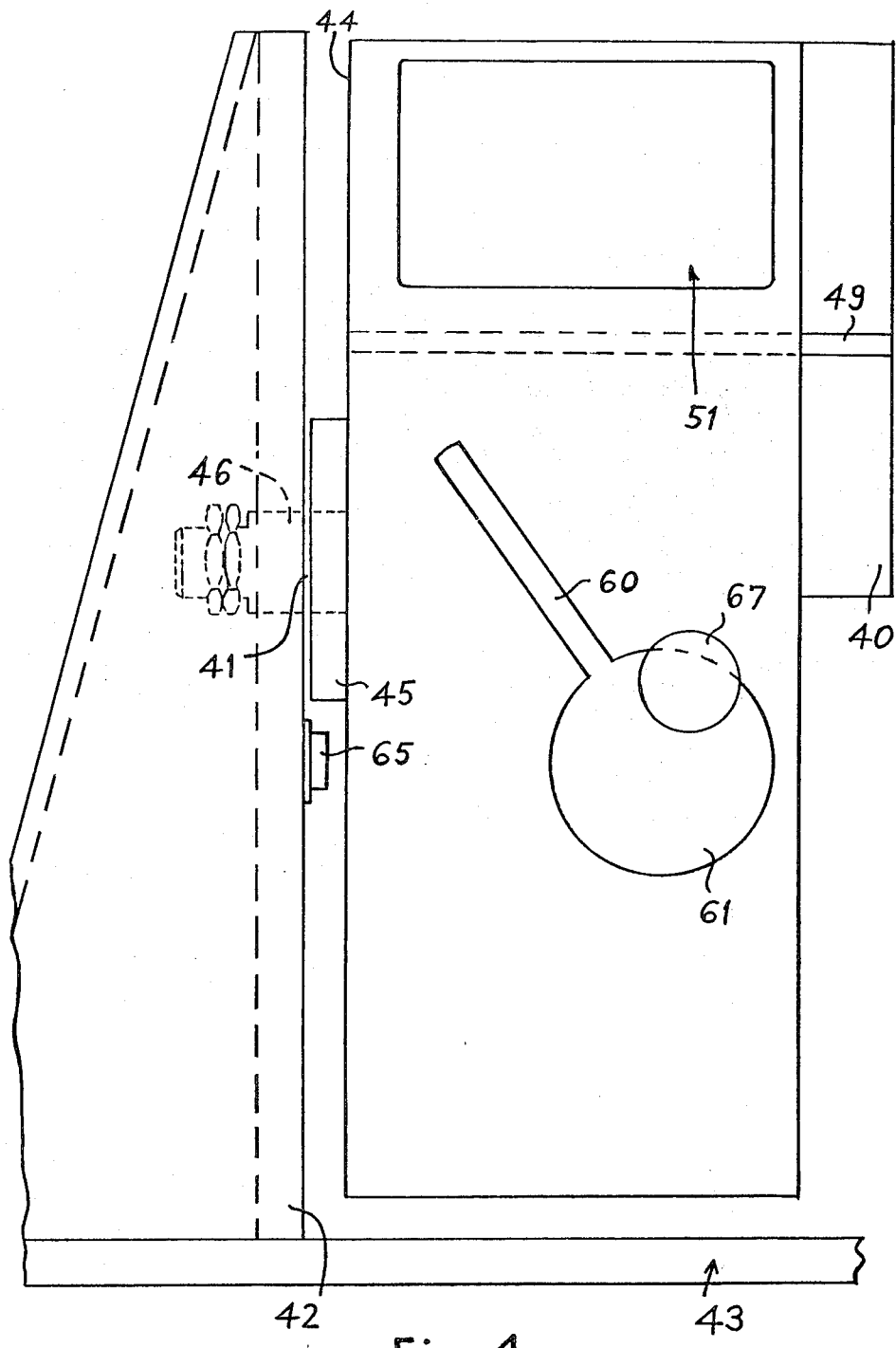
FIG. 4 is a side view of the apparatus to a smaller scale and shown somewhat schematically to indicate the rotation axis of the housing.
Figure 5:
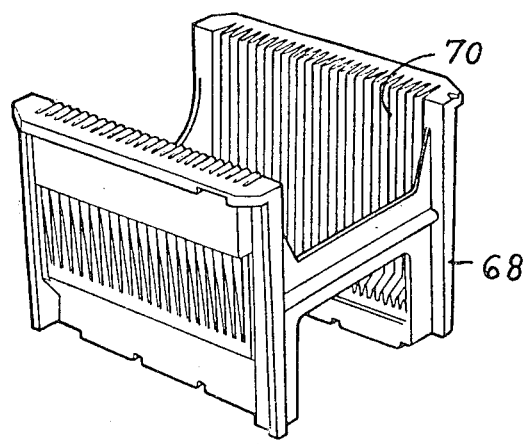
FIG. 5 is a view of a carrier.
Figure 6:
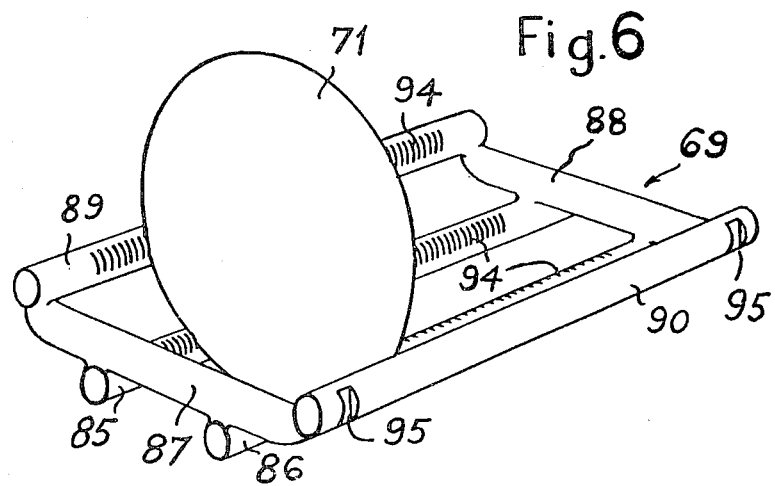
FIG. 6 is a view of a first type of magazine.
Figure 7:
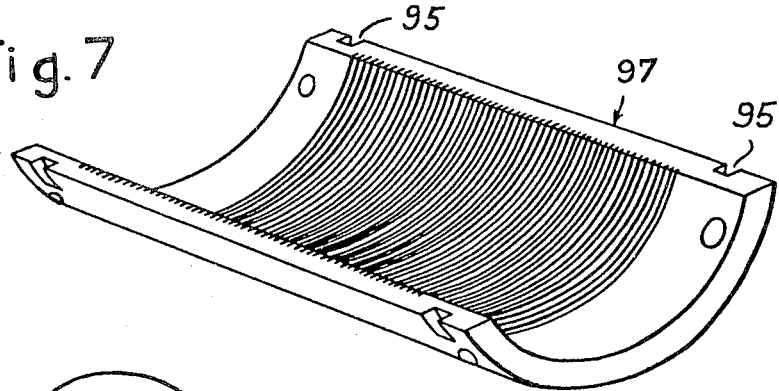
FIGS. 7 and 8 are views of second and third types of magazine, respectively.
Figure 8:
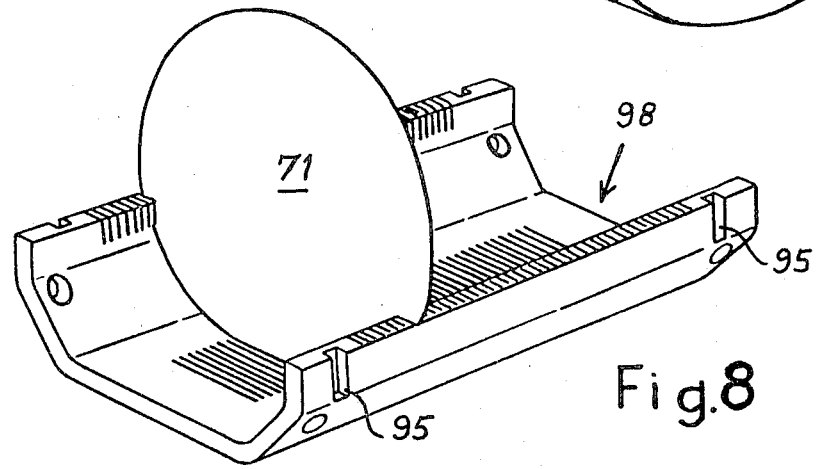

Referring now to FIGS. 2 to 9 of the accompanying drawings, the transfer mechanism therein shown is more sophisticated than that shown in FIG. 1 and comprises a housing 40 rotatable about a horizontal axis (see FIG. 4) in the vertical wall 42 of a stand 43. This horizontal axis takes the form of a shaft projecting axially from the rear end 44 of the housing, passing through a boss 45, to engage in antifriction bearings 46 in an aperture in the vertical wall 42 of the stand 43 (FIG. 4). The frontal end of the upper part of the housing 40 is open at 47, to gain access to a shuttle baffle 48 that is in two vertically-separated parts 48a and 48b, the upper part 48b being slidable relative to the lower part 48a. The whole shuttle baffle unit is carried by and longitudinally slidable on, a pair of rails 49 secured to the inside of housing 40, the sides of the shuttle baffle being grooved at 50 for this purpose. The housing also has a lateral loading and unloading port 51.

To the frontal end of the shuttle baffle 48a is secured a flange 52 through a threaded aperture in which passes a threaded operating shaft, whose front end is secured to a hand lever 53, movement of which effects a translational indexing movement of the upper part 48b of the shuttle baffle with respect to the lower part 48a but the two parts cannot be vertically separated due to a dove-tail-grooved connector 48c between them, the rear end of the shaft secured to lever 53 bearing on the front end of part 48b. The translational movement of part 48b is stopped by a stop disc or plate secured to the rear face of part 48a (not shown). The rear end of said shaft may be coupled to the front end of part 48b in such a manner that the shaft can rotate, or the part 48b may be spring-loaded so that in any event rotation of lever 53 in one direction will affect a front to rear translation of the part 48b and a movement of lever 53 in the opposite direction will affect a rear to front translation of the part 48b.

In the lower part of housing 40 there is provided a platform 54 to which is secured a guide boss 55 through which passes a lifting pillar 56 to the upper end of which are secured lifting bars 57. A rack (not shown) is formed in or attached to the front longitudinal circumference of pillar 56, which rack is engaged by a pinion 58 secured to a shaft 59 which passes through the walls of the lower part of housing 40 as shown. To one end of shaft 59 is secured a handle 60, conveniently via a disc 61, outside the housing whereby rotation of handle 60 rotates shaft 59 to cause a vertical movement of pillar 56 and lifting bars 57.

The spindle 59 also carries a cam disc 62 inside the casing and a locking rod 63 passes through the rear wall of housing 40 and is supported at its front end in a bracket 64 secured to the inner wall of the housing. The locking rod 63 passes rearwardly into an apertured boss 65 in vertical wall 42 of stand 43 so as to secure the housing 40 against rotation. The front end of rod 63 is spring-urged against the periphery of cam disc 62 so that when a cut-out 66 in cam disc 62 meets the front end of locking rod 63, the latter is urged forwardly to free the rear end of rod 63 from the apertured boss 65 in vertical wall 42 to allow rotation of housing 40 about its horizontal mounting spindle 41. Similarly, the disc 61 carries a spring-loaded plunger, (not shown) passing therethrough into an aperture in the adjacent side wall of housing 40 the exterior end of this plunger bearing a locking knob 67. It will be clear that at a suitable angular position of handle 60, this plunger will automatically enter the aperture and lock the shaft 59 against further rotation until the plunger is withdrawn by hand to release the shaft 59.

This construction enables transfer of articles from a carrier 68 to a magazine 69 and vice versa, the carrier 68, being a cage open at top and bottom (see particularly FIG. 5), and its side walls being grooved at 70 so as to receive a number of articles e.g. discs 71, the spacing between these side walls being such as to retain the articles 71 at diametrically opposite points so that they depend towards the open bottom of the cage.

The interior walls of parts 48a and 48b of shuttle baffle 48 are also grooved at 72 and 73 to allow passage of the articles 71 as will be explained. The spacing between the grooves 73 is half that between the grooves 72 so that selected ones of the grooves 73 can be used when transferring articles 71 from a carrier 68 to a magazine 69 and vice versa by effecting appropriate indexing horizontal travel of the upper part 48b of the baffle 48 by operation of lever 53 as will be referred to later.

Preferably the grooved portions take the form of separate insert bodies 74, 75 screwed or otherwise secured to the respective baffle parts so that they may be removed for easy cleaning. Whilst any material found suitable may be used to make the baffle, it has been found that polypropylene is a very suitable material for the body of the shuttle and the groove-inserts may be of any suitable temperature-stable material such as PFTE (polytetrafluoroethylene) or PFA (perfluoro-alkane). The magazine 69 is made from fused silica and the stand 43 and housing 40 may be made from any suitable rigid plastics material as are the other parts. The pinion 58 and its associated rack may be made from nylon.

In using the apparatus, a magazine 69 may be located on the top face of the shuttle 48 between opposed pairs of pegs 76 or 77 at each end of the baffle. These pegs are mounted on sliders 78, one at each corner of the upper face of the baffle. As will be apparent from the drawings, particularly FIG. 3, the respective pegs 76 and 77 are longitudinally staggered so that the width across the baffle top between each pair 76 and 77 is different. Thus magazines of two different widths can be located as desired by removing each slider 78, turning it through 180° and replacing it so as to use alternative pegs.

The upper part 48b of the baffle has a removable rectangular side portion 48d which is located on the main portion by pegs 79 projecting from the lateral inner faces of the other portion and into holes 80 as shown. Alternatively the pegs may be on one portion only and the apertures in the other if desired. The two portions are locked together under the control of a locking knob 81 mounted for example at the end of a spindle having a detent engaging in a cut-out or aperture in the under-part of the upper peg 79. Any desired locking arrangement may be used, and since it may take any of the forms well known by those experienced in mechanical techniques it need not be, and therefore has not been, further described or illustrated here. A handle member 82 is provided to enable the portion 48d to be easily manipulated. A support platform 83 is located above and spaced from the baffle 48 on posts 84 to prevent the magazine 69 from falling out by gravity when the housing is rotated through 180° with respect to the position shown in FIG. 2 for the purpose which will be referred to later.

The removable block portion 48d of the upper part 48b of baffle 48 can be removed laterally from the housing through the aperture 51 in the side wall thereof.

The magazine 69 (FIG. 6) is constituted by two longitudinal struts 85 and 86 joined together by transverse struts 87 and 88 and two further longitudinal struts 89 and 90 secured to the ends of the struts 87 and 88. The struts 85 and 86 may be provided with apertures whereby the magazine can be loaded into and removed from the shuttle baffle 48 by a forked hand tool 91 (FIG. 9) comprising a handle device having two spaced tines 92, 93 arranged to be passed into the apertures or simply beneath the struts 80 and 90.

The interior surfaces of the struts 85, 86, 89 and 90 are transversely grooved at 94, each set of four grooves being intended to accommodate one article such as a disc 71, but the spacing between the grooves in these struts as well as the grooves 73 in part 48b of the shuttle 48, is half that of the grooves 70 in carrier 68 and grooves 72 in part 48a of the baffle 48, so that the magazine 69 is capable of holding twice as many articles as the carrier 68. However, it will be appreciated that this pertains only to the embodiment shown and the holding capabilities of the members may be varied as desired. The struts 89 and 90 are notched at 95 to receive the pegs 76 or 77 on the baffle.

The operating procedure for using the transfer apparatus hereinabove described will now be set forth.

To load a magazine 69 in two stages, from two loaded carriers 68, the locking knob 67 is pulled outwardly to enable the handle 60 to be rotated clockwise thus raising the lifting bars 57, until the handle 60 locks the shaft 59 against further rotation. The housing 40 is then rotated clockwise through 180° until it reaches its stop position. The machine is now in the mode opposite that shown in FIG. 2 with the support platform 83 lowermost.

At this juncture the locking knob 81 in baffle part 48b is withdrawn to release baffle part 48c which can then be removed by handle 82 through the side opening 51 of the housing 40.

To avoid touching the magazine by hand which would transfer undesired grease thereto, a magazine 69 is lifted by lifting fork 91 and placed on the platform 83, the pegs 76 and 77 on the baffle engaging in the notches 95 of the magazine. Then the locking knob 81 is pulled out and the removable portion 48c of the baffle is replaced, whereupon the housing 40 can be returned to its initial position by rotating it anti-clockwise through 180°.

Next, assuming that the upper portion 48b of the baffle is towards the front of the apparatus, the lever 53 is turned from right to left until the movement of this upper portion away from the operator ceases when its rear end reaches its stop.

At this stage the locking knob 67 is pulled out to release the associated peg from the side wall of the housing and the handle 60 is rotated clockwise to rotate shaft 59 and lower the lifting bars 57 to the start position.

A first carrier member loaded with articles such as silicon wafers 71 is then placed on the floor 96 of the housing 40 whereupon the locking knob 67 is again pulled out to re-rotate the handle 60 clockwise to raise the lifting bars 57 until the handle 60 locks in position again. This transfers the articles 71 from the carrier 68 into the lower portion 48a of the baffle and up into alternate grooves in parts 48b and 48d and hence into the magazine 69, but the travel of the lifting bars 57 is arranged so that the articles 71 are not fully "home" in the magazine 69, being short by say, 2 mm, i.e. they do not bottom in the grooves 94.

The housing 40 is then rotated clockwise by 180° until it reaches the stop. The lever 53 is then moved from left to right to translate the upper portion 48b and 48d of the baffle towards the operator. The housing 40 is then rotated anti-clockwise by 180° until it reaches the stop when the locking knob 67 can again be released to lower the lifting bars 57 by operating handle 60 anti-clockwise until the bars 57 are at the start position again.

The first carrier 68, which is now empty, can now be removed and replaced by a second one loaded with articles 71 and the operations described above can be recommenced except that translation of the upper part 48b and 48d of the baffle will close off those grooves in the magazine 69 and render the second alternate set of grooves therein accessible to receive the articles from the second carrier 68, still however not fully "home" in the magazine.

Figure 2:
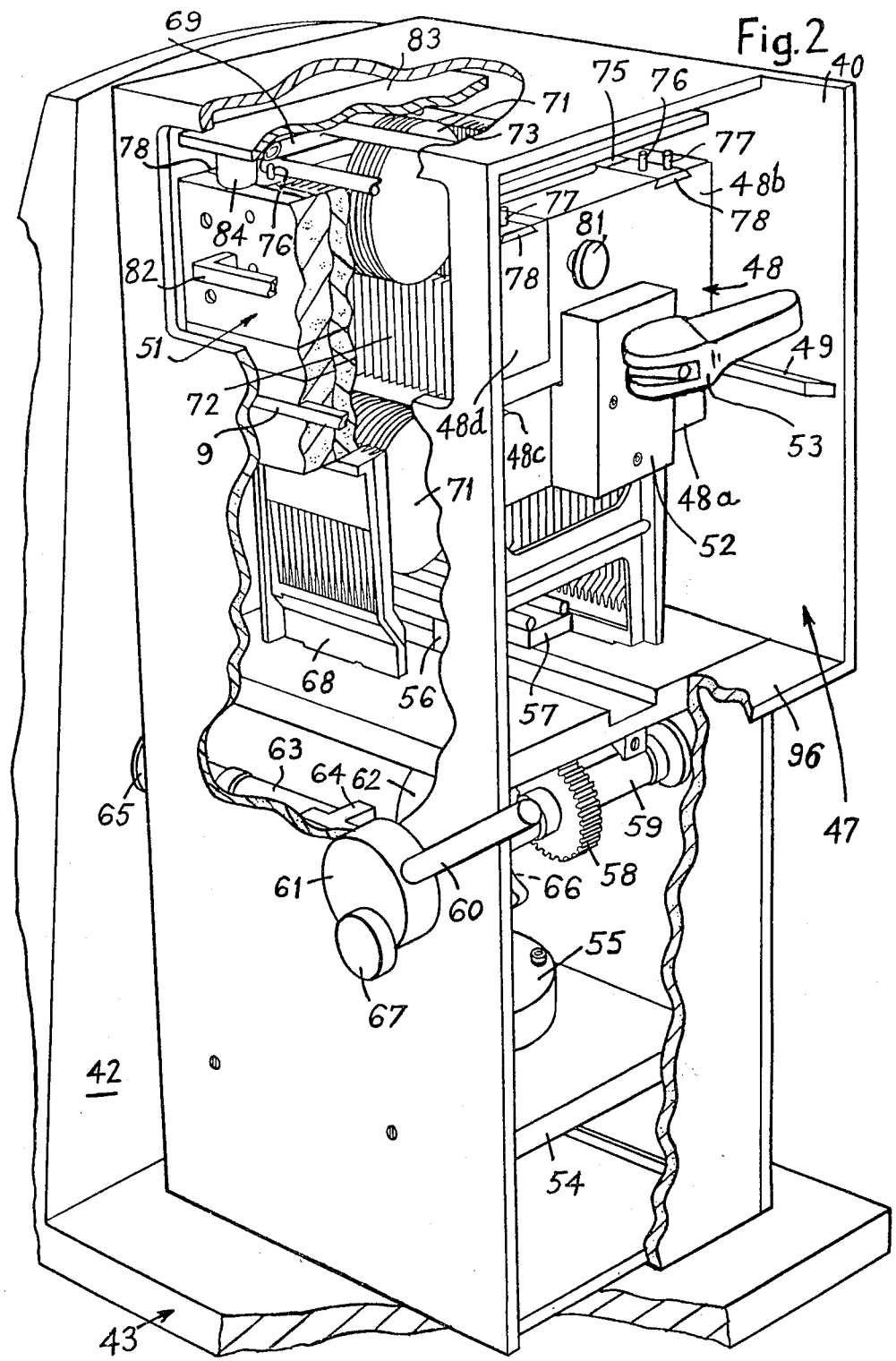
FIG. 2 is a three-quarter view from the front of a second embodiment of a complete apparatus.
Figure 3:
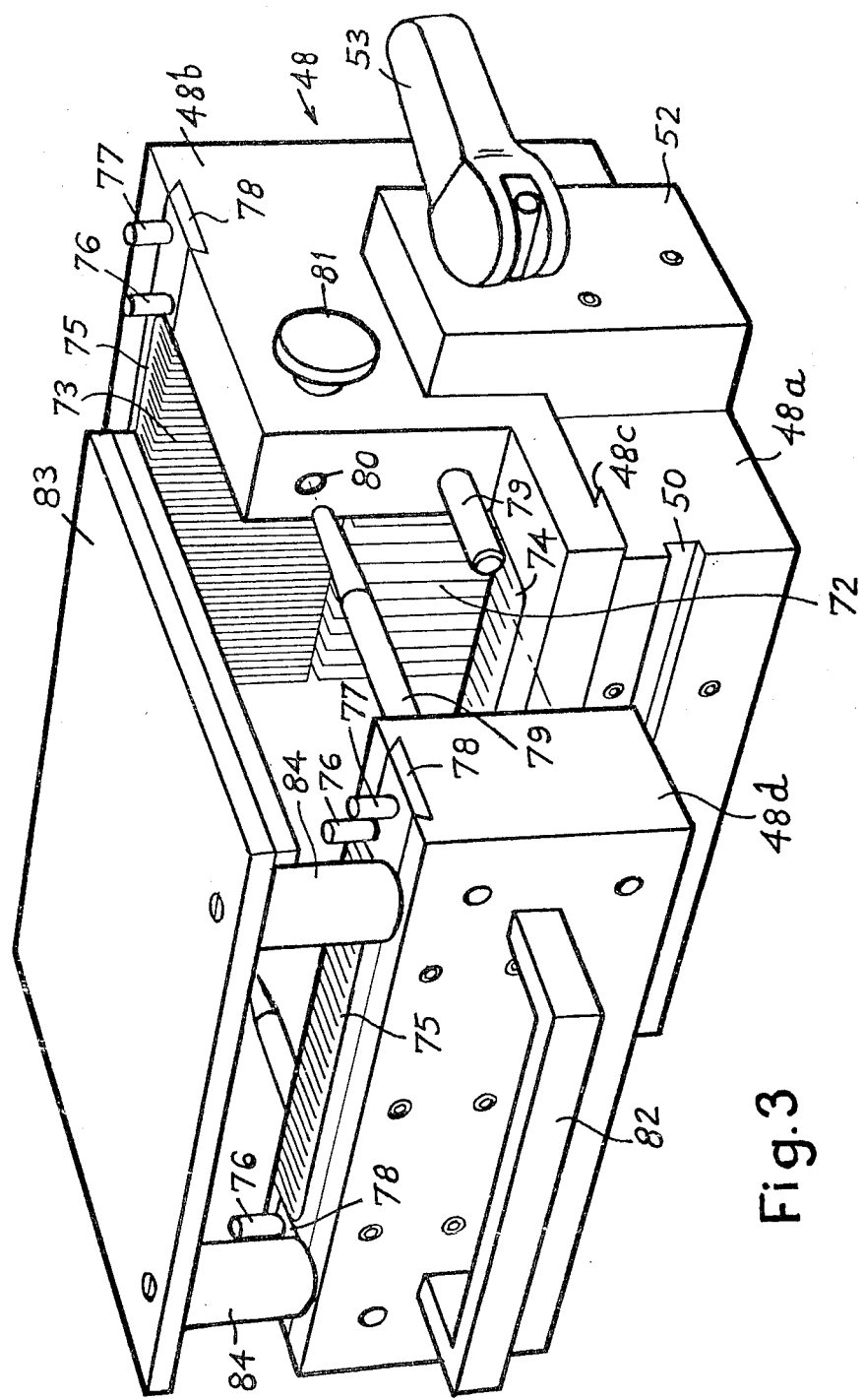
FIG. 3 is a view of the shuttle baffle, to a larger scale, with a lateral portion separated.

Now, with the fully loaded magazine in the upper part 48b and 48d of the baffle, the housing 40 can again be rotated clockwise through 180° away from its stop until it reaches again the position opposite that shown in FIG. 2 i.e. with the platform 83 of the shuttle baffle 48 lowermost. As the housing reaches this position, the articles will drop the last little distance completely "home" into the magazine but, due to the small travel of about 2 mm, they will not suffer any damage which is a fault experienced in transfer devices of the prior art even those employing an arrangement to perform a similar kind of indexing movement as described above to effect a transfer between two frame sections having single and double groove spacing and indexing movements between the sections analogous to that of the present invention.

With the articles 71 safely "home" in the magazine 69, the locking knob 81 can then be pulled out to remove the removable block portion 48d of the shuttle baffle 48 by handle 82, together with the fully loaded magazine 69, which can then be taken off the platform 83 by the lifting fork 91.

To carry out the reverse operation to unload a fully loaded magazine into two carriers 69 in two stages, the procedure described above is virtually repeated and can be summarised as follows.

The apparatus is, for this purpose of course in the reverse position to that shown in FIG. 2. The fully loaded magazine is placed on the platform 83, the locking knob 81 is pulled out and the removed block 48d is replaced and the housing 40 with the loaded magazine is rotated by 180° until it meets the stop. The locking knob 67 is then pulled out and the lifting bars 57 lowered by operating handle 60 so that the carrier 68, previously placed on base 96, and now filled with articles 71 can be removed by hand and replaced by an empty second carrier 68. Then locking knob 67 is pulled out, lifting bars 57 are raised by turning handle 60 and housing 40 is rotated clockwise by 180°. At this juncture the lever 53 is moved from left to right until the movement of the parts 48b and 48d of the baffle away from the operator ceases whereupon the housing 40 is again rotated anti-clockwise by 180° until it reaches the stop so that locking knob 67 can again be operated to lower bars 57 until handle 60 locks to allow the second loaded carrier 68 to be removed.

At this stage, the magazine 69 is still in the apparatus so the knob 67 must be operated to turn handle 60 to raise bars 57 until handle 60 locks. Then housing 40 is rotated clockwise by 180° until it stops, locking knob 80 is pulled out, block 48d is removed, together with the empty magazine and the latter is removed by lifting fork 91.

The empty apparatus can now be restored to the position shown in FIG. 2 ready for another loading/unloading sequence.

Whilst only one kind of magazine 69 has been shown it will be clear that other kinds may be used. In particular the magazine may be varied to accommodate doping discs where the apparatus is used for transferring silicon wafers, by enlarging every third slot in the magazine to take a solid source disc i.e. one containing a dopant such as boron and the mechanism may be modified to enable the magazine to be loaded with "ordinary" wafers after such solid source discs are in situ.

It will also be apparent that while the apparatus has been described to perform a transfer of articles from a carrier to a magazine, it could be arranged to transfer articles between carriers or between, say a carrier and a transport case for taking away or storing finished silicon wafers after processing.

The magazine 69 may be made from low-mass silica which will withstand a furnace temperature of up to 1050° C. If it is desired to process wafers or other articles 71 in temperatures up to 1200° C. then a magazine such as shown at 87 in FIG. 7 made from silicon, or another such as 98 in FIG. 8 made from silica glass, may be used, both exhibiting the notches 95 to receive the baffle pegs 76 or 77.

I claim:

1. Method of gently transferring fragile disk-like semiconductor wafers or substrates between a wafer carrier and a magazine carrier, wherein said carriers have a bottom with an aperture formed therein, and side elements formed with slits to retain and receive said semiconductor wafers in stacked, spaced alignment, comprising the steps of
    aligning the slits in one of the carriers to retain wafers with the slits in the other of the carriers to receive wafers;
    pushing the wafer in one carrier by engagement with a plunger element against the force of gravity into the other carrier to pass nearly, but not quite wholly, into the other carrier by introducing the plunger element through the apertured bottom of one carrier and pushing the wafers from the slits in the said one carrier into the slits of the other carrier;
    retaining said plunger element against the wafers to thereby essentially remove said wafers from said first carrier member;
    and inverting the second carrier together with the plunger element to permit the wafers to drop the final distance for complete reception in the other carrier.

2. Method according to claim 1, including the step of locating said carriers in a housing;
    and wherein the inverting step comprises inverting said housing.

3. Method according to claim 1, wherein the pushing step comprises pushing said plunger element upwardly, directly counter the force of gravity, to remove said wafers from the first carrier.

4. The combination of a first carrier and a second carrier, each of which has an apertured bottom wall which is essentially unobstructed
    with
    an apparatus for transferring disk-like semiconductor wafers or substrates between the first and a second carrier, said apparatus comprising
    a displaceable housing;
    means for receiving said first carrier with the apertured bottom wall on the bottom;
    a plunger element fitting through said essentially unobstructed apertured bottom wall, and operable against the force of gravity;
    means for locating the second carrier in the housing;
    operating means engageable with the plunger element and controlling projecting movement of the plunger along a distance shorter than that represented by a final desired position of the wafers in the second carrier to lift the wafers out of the first carrier and place the wafers nearly, but not quite wholly, into the second carrier;
    and means for inverting the housing together with both said carriers and with said plunger element, while in a projected position to permit completion of travel of the wafers into the second carrier by gravity and for the difference of the distance through which the wafers were lifted by said plunger element, and the final desired position.

5. The combination of claim 4, including a base;
    and wherein the means for inverting the housing comprises means for rotating the housing with respect to the base.

6. The combination of claim 5, further including locking means to lock the housing to the base in a predetermined position to prevent inadvertent rotation of the housing before transfer of the articles.

7. The combination of claim 4, including loading-and-unloading ports formed in said housing to enable said carriers to be loaded into and unloaded from said housing.

8. The combination of claim 7, wherein said loading-and-unloading ports are located frontally with respect to the housing.

9. The combination of claim 7, wherein said loading-and-unloading ports are located laterally with respect to the housing.

10. The combination of claim 4, wherein said plunger element comprises a lifting pillar and engagement means secured to the lifting pillar for engagement with said wafers, the lifting pillar and said engagement means being dimensioned to fit into and pass through the apertured bottom wall of said first carrier.

11. The combination of claim 4, wherein
    said carriers comprise semiconductor carriers formed with slits or grooves to receive the wafers in spaced, stacked, aligned locations;
    and the housing includes baffle means having grooves for transfer of the wafers in spaced, parallel aligned position from one of said carriers to the other upon engagement thereof by said plunger element to maintain the respective parallel aligned arrangement in which the wafers were retained in the first carrier also in the second carrier upon transfer thereinto.

12. The combination of a first carrier member which has an apertured bottom wall
    with an apparatus for transferring articles between the first and a second carrier member, said apparatus comprising a displaceable housing;

means for receiving said first carrier member with the apertured bottom wall on the bottom;

a plunger element fitting through said apertured bottom wall, and operable against the force of gravity;

means for locating the second carrier member in the housing;

operating means engageable with the plunger element and controlling projecting movement of the plunger along a distance shorter than that represented by a final desired position of the articles in the second carrier member to lift the articles out of the first carrier member and nearly, but not quite wholly, into the second carrier member;

and means for inverting the housing together with both carrier carrier members and with said plunger element, while in a projected position to permit completion of travel of the articles into the second carrier member by gravity and for the difference of the distance through which the articles were lifted by said plunger, and the final desired position;

wherein said housing includes a baffle means adapted to receive articles from said first carrier member as the articles are passed to the second carrier member, wherein said baffle means comprises two parts slidably engaged one above the other;

slits or grooves formed in both said parts, the slits or grooves in a first part being spaced apart by half the distance between the grooves or slits of the second part, whereby selected grooves in the first part can be used for transfer of articles through said baffle;

and indexing means are provided to effect sliding movement of one part with respect to the other part for selected alignment of said grooves or slits and to permit alignment of a selected set of grooves or slits of the first part after another selected set of grooves has been occupied by articles transferred through said parts.

13. The combination of claim 12, wherein one part of said baffle is subdivided into two sections;

one of the sections being laterally removable from another section thereof;

a loading/unloading port being formed in said housing, said removable section being removable through said port of the housing;

and interengaging peg-and-aperture means formed on said sections and retaining said sections in mutually oriented, adjustable position.

14. The combination of claim 12, further comprising inserts in said parts of said baffle means, the grooves or slits being formed in said inserts.

15. The combination of claim 14, further comprising a base or support platform;

and support posts securing the first part of said baffle means to the base or platform.

16. The combination of claim 12, wherein the articles comprise semiconductor disks or wafers;

and wherein said means for inverting the housing comprises rotary means operable about an axis of rotation extending perpendicularly to a plane parallel to the major surface of said disks or wafers.

17. The combination of claim 12, wherein said articles comprise semiconductor disks or wafers;

and said slits or grooves are dimensioned to receive one disk or wafer in one groove.

18. The combination of claim 12, including loading-and-unloading ports formed in said housing to enable said carriers to be loaded into and unloaded from said housing.

19. The combination of claim 12, wherein said plunger element comprises a lifting pillar and engagement means secured to the lifting pillar for engagement with said wafers, the lifting pillar and said engagement means being dimensioned to fit into and pass through the apertured bottom wall of said first carrier.

* * * * *